(12) United States Patent
Choy et al.

(10) Patent No.: US 10,768,515 B2
(45) Date of Patent: Sep. 8, 2020

(54) METHOD FOR MANUFACTURING ULTRA-DENSE LED PROJECTOR USING THINNED GALLIUM NITRIDE

(71) Applicant: Spy Eye, LLC, Palo Alto, CA (US)

(72) Inventors: Kwong-Hin Henry Choy, San Jose, CA (US); Paul Scott Martin, Palo Alto, CA (US)

(73) Assignee: Tectus Corporation, Saratoga, CA (US)

( * ) Notice: Subject to any disclaimer, the term of this patent is extended or adjusted under 35 U.S.C. 154(b) by 0 days.

(21) Appl. No.: 16/154,603

(22) Filed: Oct. 8, 2018

(65) Prior Publication Data
US 2019/0179222 A1 Jun. 13, 2019

Related U.S. Application Data

(60) Provisional application No. 62/597,680, filed on Dec. 12, 2017.

(51) Int. Cl.
*H01L 29/18* (2006.01)
*G03B 21/20* (2006.01)
(Continued)

(52) U.S. Cl.
CPC ..... *G03B 21/2033* (2013.01); *G02B 27/0172* (2013.01); *G03B 21/2013* (2013.01);
(Continued)

(58) Field of Classification Search
CPC ....... H01L 33/52; H01L 33/62; H01L 27/153; H01L 27/156; H01L 25/167; G03B 21/005
See application file for complete search history.

(56) References Cited

U.S. PATENT DOCUMENTS 4,268,842 A 5/1981 Jacob
4,408,217 A 10/1983 Kobayashi
(Continued)

FOREIGN PATENT DOCUMENTS

WO 2009143802 A1 12/2009
WO 2011029935 A2 3/2011
WO 2016079505 A1 5/2016

OTHER PUBLICATIONS

Hernsdorf, J. et al., "Active-Matrix GaN Micro Light-Emitting Diode Display with Unprecedented Brightness," IEEE Transactions on Electron Devices, Jun. 2015, vol. 62, No. 6, pp. 1918-1925.
(Continued)

*Primary Examiner* — Phuc T Dang
(74) *Attorney, Agent, or Firm* — Fenwick & West LLP

(57) ABSTRACT

A small projector uses an ultra-dense array of gallium nitride (GaN) LEDs. However, epitaxial growth of GaN typically produces a GaN region that is 5um or thicker. To achieve high pixel density, the LEDs have small area, so the resulting LED structures are tall and skinny. This is undesirable because it makes further processing more difficult and has higher optical losses. As a result, it is beneficial to reduce the thickness of the GaN region. In one approach, a wafer with the GaN region on substrate is bonded to a backplane wafer containing LED driver circuits. The substrate is then separated from the GaN region, exposing a buffer layer of the GaN region. The GaN region is thinned and then patterned into individual LEDs. Typically, the buffer layer is removed entirely.

24 Claims, 14 Drawing Sheets

(51) Int. Cl.

| | | |
|---|---|---|
| *H01L 33/44* | (2010.01) | |
| *G03B 21/28* | (2006.01) | |
| *H01L 33/32* | (2010.01) | |
| *G02B 27/01* | (2006.01) | |
| *H05B 45/00* | (2020.01) | |
| *G02C 7/04* | (2006.01) | |

(52) U.S. Cl.
CPC .............. *G03B 21/28* (2013.01); *H01L 33/32* (2013.01); *H01L 33/44* (2013.01); *H05B 45/00* (2020.01); *G02C 7/04* (2013.01)

(56) References Cited

U.S. PATENT DOCUMENTS

| | | | |
|---|---|---|---|
| 4,608,581 A | | 8/1986 | Bagratishvili |
| 4,707,726 A | | 11/1987 | Tinder |
| 5,534,444 A | | 7/1996 | Nissim |
| 6,023,076 A | | 2/2000 | Shibata |
| 6,233,265 B1 | | 5/2001 | Bour |
| 6,410,940 B1 | | 6/2002 | Jiang |
| 7,592,637 B2 | | 9/2009 | Zimmerman |
| 8,058,663 B2 | | 11/2011 | Fan |
| 8,552,436 B2 | | 10/2013 | Bibl |
| 9,041,025 B2 | | 5/2015 | Lau |
| 9,047,818 B1 | | 6/2015 | Day |
| 9,196,653 B2 | | 11/2015 | Leatherdale |
| 2006/0055309 A1 | | 3/2006 | Ono |
| 2008/0128728 A1 | | 6/2008 | Nemchuk |
| 2009/0162959 A1 | * | 6/2009 | Hsu .......................... H01L 33/20 438/33 |
| 2010/0060553 A1 | | 3/2010 | Zimmerman |
| 2011/0226937 A1 | | 9/2011 | Yu |
| 2012/0074424 A1 | * | 3/2012 | Lee ...................... H01L 21/2007 257/76 |
| 2012/0154876 A1 | | 6/2012 | Shimoda |
| 2012/0205613 A1 | * | 8/2012 | Mi .......................... B82Y 10/00 257/9 |
| 2012/0223875 A1 | | 9/2012 | Lau |
| 2012/0276701 A1 | | 11/2012 | Yedinak |
| 2013/0126827 A1 | | 5/2013 | Bibl |
| 2014/0070263 A1 | | 3/2014 | Choi |
| 2016/0163918 A1 | * | 6/2016 | Dasgupta ................ H01L 33/16 257/13 |
| 2016/0356901 A1 | | 12/2016 | Shao |
| 2017/0069612 A1 | * | 3/2017 | Zhang .................. G03B 21/005 |
| 2018/0151543 A1 | * | 5/2018 | Lee .......................... H01L 33/60 |
| 2018/0261736 A1 | | 9/2018 | Bonar |

OTHER PUBLICATIONS

Choi, H.W. et al., "High-Resolution 128 × 96 Nitride Microdisplay," IEEE Electron Device Letters, May 2004, vol. 25, No. 5., pp. 277-279.

Day, J. et al., "III-Nitride Full-Scale High-Resolution Microdisplays," Applied Physics Letters, 2011, vol. 99, No. 031116, 2 pages.

Kang, C-M. et al., "Fabrication of a Vertically-Stacked Passive-Matrix Micro-LED Array Structure for a Dual Color Display," Optics Express, Feb. 6, 2017, vol. 25, No. 3, 7 pages.

Henry, W., "MicroLED Arrays Find Applications in the Very Small," Photonics Media, Mar. 2013, 7 pages.

* cited by examiner

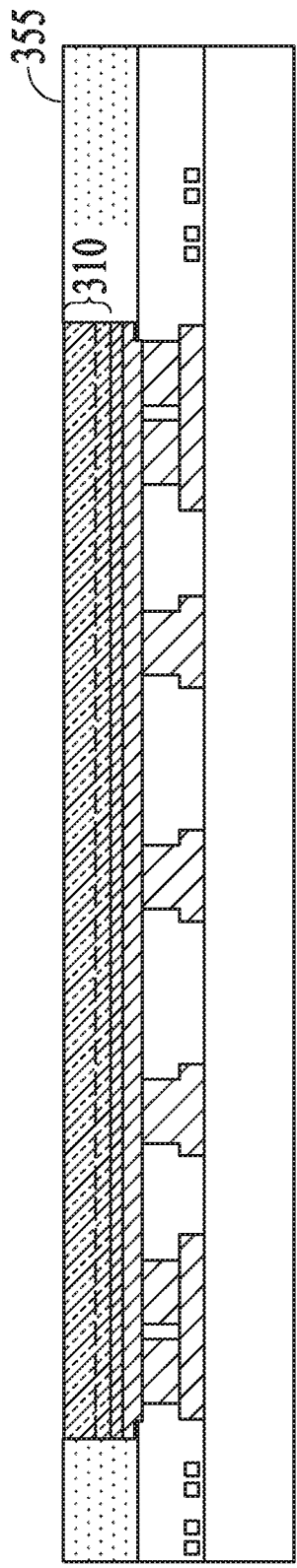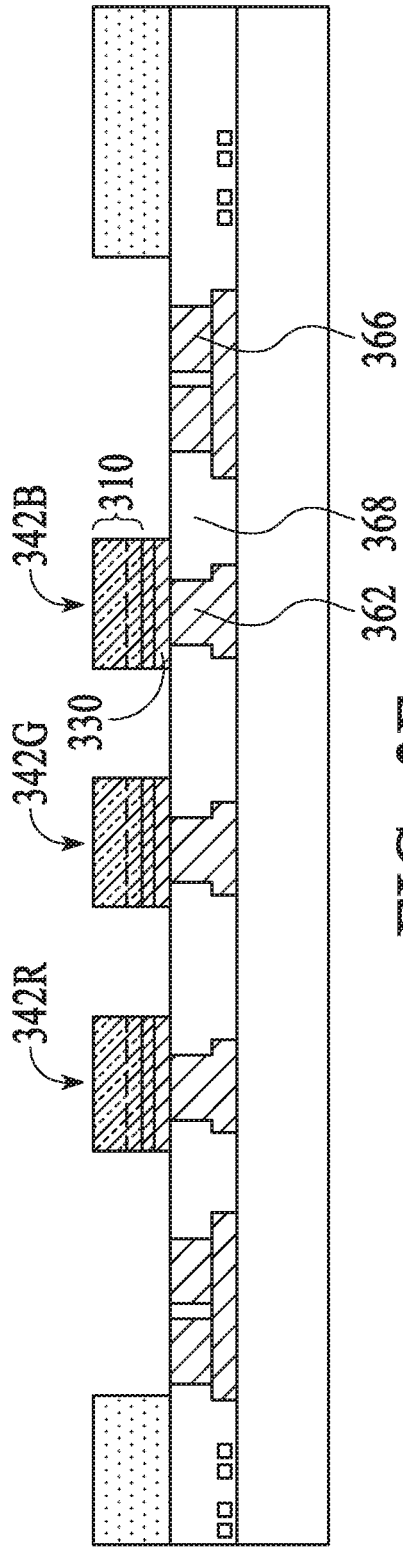

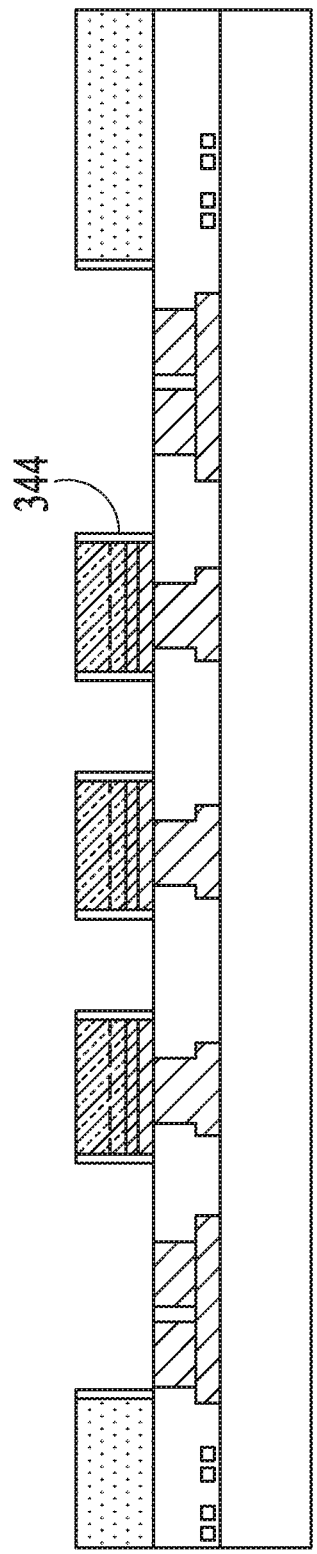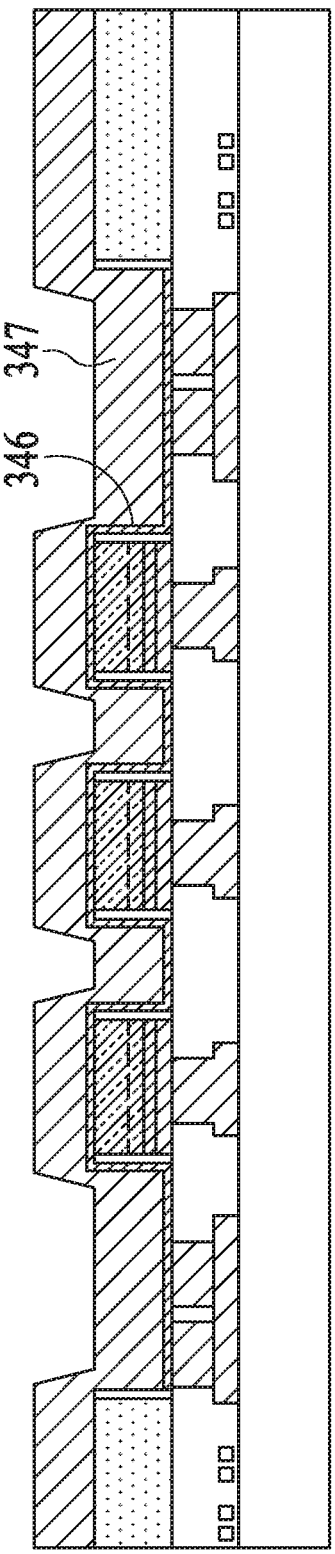

METHOD FOR MANUFACTURING ULTRA-DENSE LED PROJECTOR USING THINNED GALLIUM NITRIDE

CROSS-REFERENCE TO RELATED APPLICATION(S)

This application claims priority under 35 U.S.C. § 119(e) to U.S. Provisional Patent Application Ser. No. 62/597,680, "New Display Process Flow," filed Dec. 12, 2017. The subject matter of all of the foregoing is incorporated herein by reference in its entirety.

BACKGROUND

1. Technical Field

This disclosure relates generally to light emitting diode (LED) displays and, more specifically, to an ultra-dense gallium nitride LED display, such as for use in a contact lens.

2. Description of Related Art

A conventional LED direct emission display uses discrete red, green, and blue emitting LEDs arranged in an addressable array of composite pixels. Such displays have a fairly large pixel spacing due to the use of separate LED dies. Displays of this type typically have resolutions of up to 500 pixels per inch (composite white pixels/inch) and about a 25 um (micron) pitch from one colored pixel to the neighboring color pixel.

In another approach, red, green, and blue emitting LEDs are combined on a single die. However, the practical minimum pixel pitch achievable by conventional monolithic LED display technology is about 5-10 um with pixels several microns in size. Such LED displays may be referred to as micro-displays since each pixel is several square microns in area. Very small displays may require die sizes of 1 mm or less. Such an LED display constructed using conventional technology typically is limited in resolution or composite white pixel count.

Accordingly, what is needed are better approaches to forming an ultra-dense (and, therefore, correspondingly higher resolution) LED display.

BRIEF DESCRIPTION OF THE DRAWINGS

Embodiments of the disclosure have other advantages and features which will be more readily apparent from the following detailed description and the appended claims, when taken in conjunction with the examples in the accompanying drawings, in which:

DETAILED DESCRIPTION OF THE PREFERRED EMBODIMENTS

Figure 1:
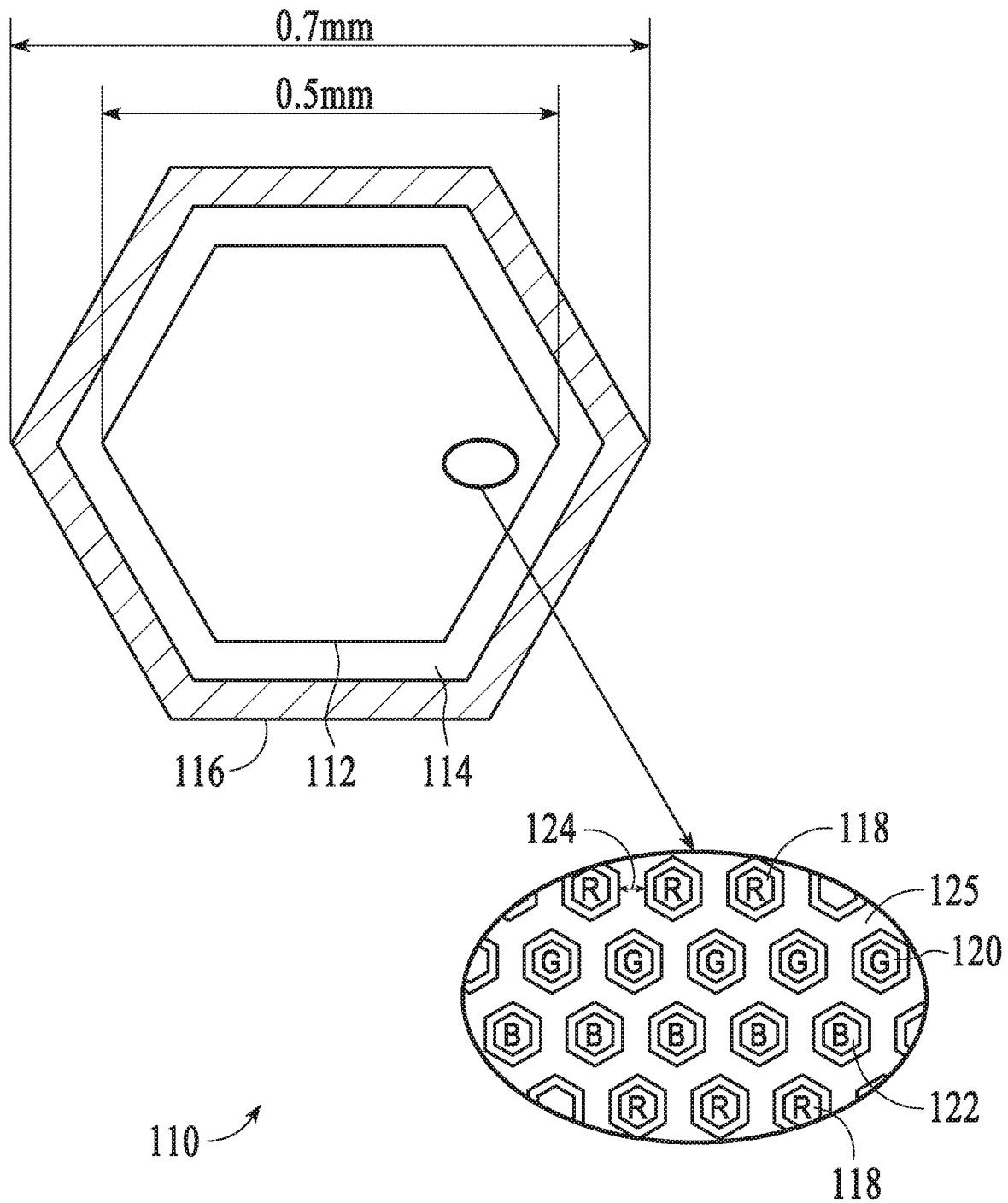
FIG. 1 shows a top down view of a frontplane for a femtoprojector display, and a magnified view of a hexagonal LED array within the frontplane.

The figures and the following description relate to preferred embodiments by way of illustration only. It should be noted that from the following discussion, alternative embodiments of the structures and methods disclosed herein will be readily recognized as viable alternatives that may be employed without departing from the principles of what is claimed.

A "femtoprojector" is a small projector that projects images from a display contained inside a contact lens onto a user's retina. The display and associated optical system are small enough to fit inside a contact lens. To meet this size requirement while still achieving reasonable resolution, the pixel sizes in the image source typically are much smaller than in image sources for other applications. For example, a conventional LED direct emission display uses discrete red, green, and blue emitting LEDs with resolutions of up to 500 pixels per inch (composite white pixels/inch) and about a 25 um (micron) pitch from one colored pixel to the neighboring color pixel. In contrast, a display for a femtoprojector preferably has pixel sizes of less than 1 $um^2$ in emitting area with a pixel pitch of 2 um or less, so that when the displayed image is projected onto the retina, the image resolution may also be commensurate with the density of light receptors in the retina.

Gallium nitride (GaN) is a common material system used to fabricate LEDs. In a typical fabrication process, GaN layers are deposited on a substrate such as sapphire. From the substrate upwards, the GaN region may include a buffer region, an n-doped region, an active region (e.g., InGaN quantum wells) and a p-doped region. The distance from the substrate to the active region (i.e., buffer region plus n-doped region) may be especially thick, for example 5um or more, because the first several microns of GaN that are directly adjacent to the substrate typically is of poor quality. This is sometimes referred to as a buffer region. Accordingly, the GaN region is grown thicker so that the material farther away from the substrate has the desired quality. If the pixels have small area, as is the case in femtoprojectors, the resulting LED structures can be tall and skinny, for example 5 um tall pillars with a 1 um wide active area. This is undesirable because light produced by the active area reflects many times off the sidewalls before leaving the LED pillar, resulting in higher optical loss. High aspect ratio structures may also create fabrication difficulties. It is more difficult to etch deep, narrow trenches, and also more difficult to fill them with metals and/or other materials.

As a result, it is beneficial to reduce the thickness of this GaN region. In one approach, a wafer with the GaN region on substrate is bonded to a backplane wafer containing LED driver circuits. The substrate is separated from the GaN region, exposing the buffer layer of GaN which is made thinner first by chemical mechanical polishing and then etching. Thinning removes the buffer layer and reduces the height of the LED pillars, which in turn reduces optical loss. Furthermore, if trenches are etched to separate the GaN region into individual LED pillars, then thinning the GaN region reduces the aspect ratio of the trenches, which makes the etching process less challenging.

Figure 2:
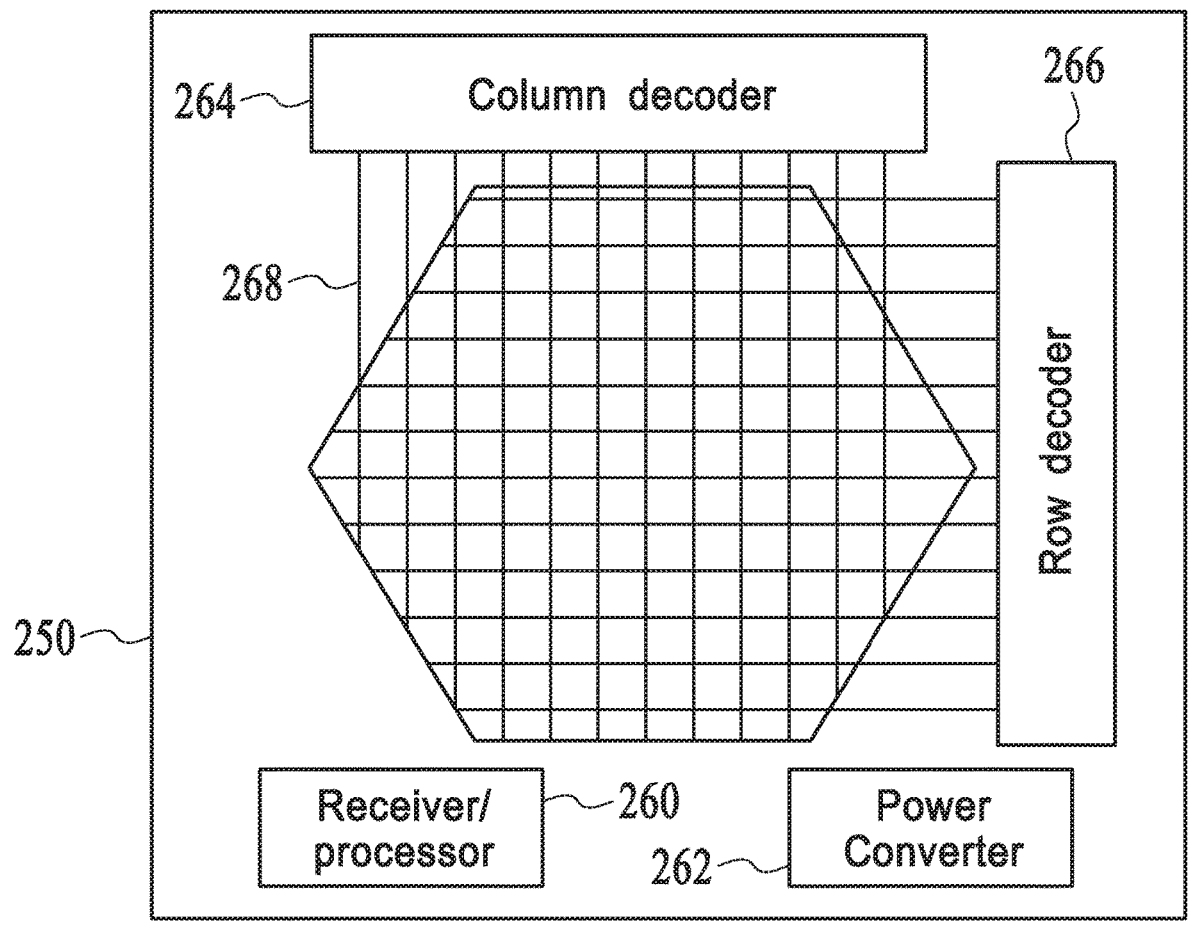
FIG. 2 shows a schematic diagram of certain circuits on a backplane for a femtoprojector display.

In many embodiments, the femtoprojector display includes a frontplane and a backplane. FIG. 1 is a diagram of the frontplane, which contains an LED array. FIG. 2 is a diagram of the backplane, which contains addressing and drive circuitry. FIG. 3 provides details for an example process for manufacturing the femtoprojector display of FIGS. 1-2.

FIG. 1 shows a top down view of a frontplane 110 for a femtoprojector display, and a magnified view of the hexagonal LED array within the frontplane. In one application, the ultra-dense LED display using this frontplane 110 may be used as a projector in a contact lens to project an image directly onto a wearer's retina. The LED array within this frontplane 110 is shown as having a hexagonal shape, but other shapes are possible. A die containing the frontplane may have a rectangular shape. The dimensions in the following descriptions are also examples.

The frontplane 110 includes a central pixel area 112, a dead space area 114, and an n-ring area 116. The area 116 is a termination area to electrically connect one contact of all the LEDs in the array to a common electrical contact on the backplane. The diameter of the frontplane components shown may be about 0.7 mm, and the diameter of the pixel area 112 may be about 0.5 mm. The width of each pixel is less than 2 um and preferably about 0.6 um. In one embodiment, the display contains more than 400,000 pixels with variable sizes of pixels from a minimum of 0.6 um to a maximum of 2 um.

Also shown in FIG. 1 is an expanded view of a portion of the pixel area 112, showing red pixels (R) 118, green pixels (G) 120, and blue pixels (B) 122. In one embodiment, the LEDs are GaN-based LEDs and the active layers of the LEDs within the pixels output blue light. The red and green pixels are formed using a phosphor, quantum dots or other color-conversion mechanisms to down convert the blue pump light to longer wavelengths. The gap 124 between pixels is less than 0.5 um and preferably about 0.2 um to increase the density, fill-factor, and resolution of the display. The space 125 between the pixels is filled with a reflective metal, such as aluminum.

The die may be rectangular, even though the display portion 110 is hexagonal. The die may also contain various silicon circuitry for processing image signals, powering the device, addressing the pixels, etc.

FIG. 2 shows a schematic diagram of certain circuits on a backplane 250 for use with the femtoprojector frontplane 110 of FIG. 1. FIG. 2 schematically illustrates one possible addressing technique used on the backplane 250 for addressing a particular pixel by applying a voltage to the associated contact for that pixel. The die may be about 0.5-1 mm wide.

Image signals may be transmitted to the backplane 250 using wireless or other means. In one embodiment, radio frequency signals (e.g., about 13 MHz) are received by an antenna and processed by a receiver/processor 260. Power for the backplane 250 may be received by the antenna via resonant inductive coupling and converted to the appropriate voltage and polarity by a power converter 262. The power signal and the image signals may be at different frequencies so that the signals can be separated. The power converter 262 and receiver/data processor 260 may be integrated into the backplane chip 250 or integrated into a separate power/data chip with the data receiver/processor 260 and the power converter 262 electrically connected to the display backplane 250 by conductors. The small size allows the femtoprojector display to be encased in a contact lens. The image signals may include addressing signals that are decoded by a column decoder 264 and a row decoder 266. Traces 268 in the device layer of the backplane 250 form an array of pixel locations. Control voltages on a selected column line and row line turn on a transistor for conducting current to the selected pixel. The color brightness may be controlled by pulse width modulation, by amplitude modulation or by other means. Low power CMOS switches may be used to address pixels. The relative brightness of the red, green, and blue pixels in a single full color pixel determines the perceived color for that composite pixel.

In an example of the display being incorporated in a contact lens, the power converter 262 and receiver/processor 110 may be separated from the backplane 250 in a separate chip, and both chips may be separately encased in the contact lens. The power/data chip is located away from the pupil so as to not obstruct vision. Small wires connect metal pads on the backplane 250 to metal pads on the power/data chip. A thin wire loop antenna is also connected to pads on the power/data chip and encased in the contact lens.

Figure 3A:
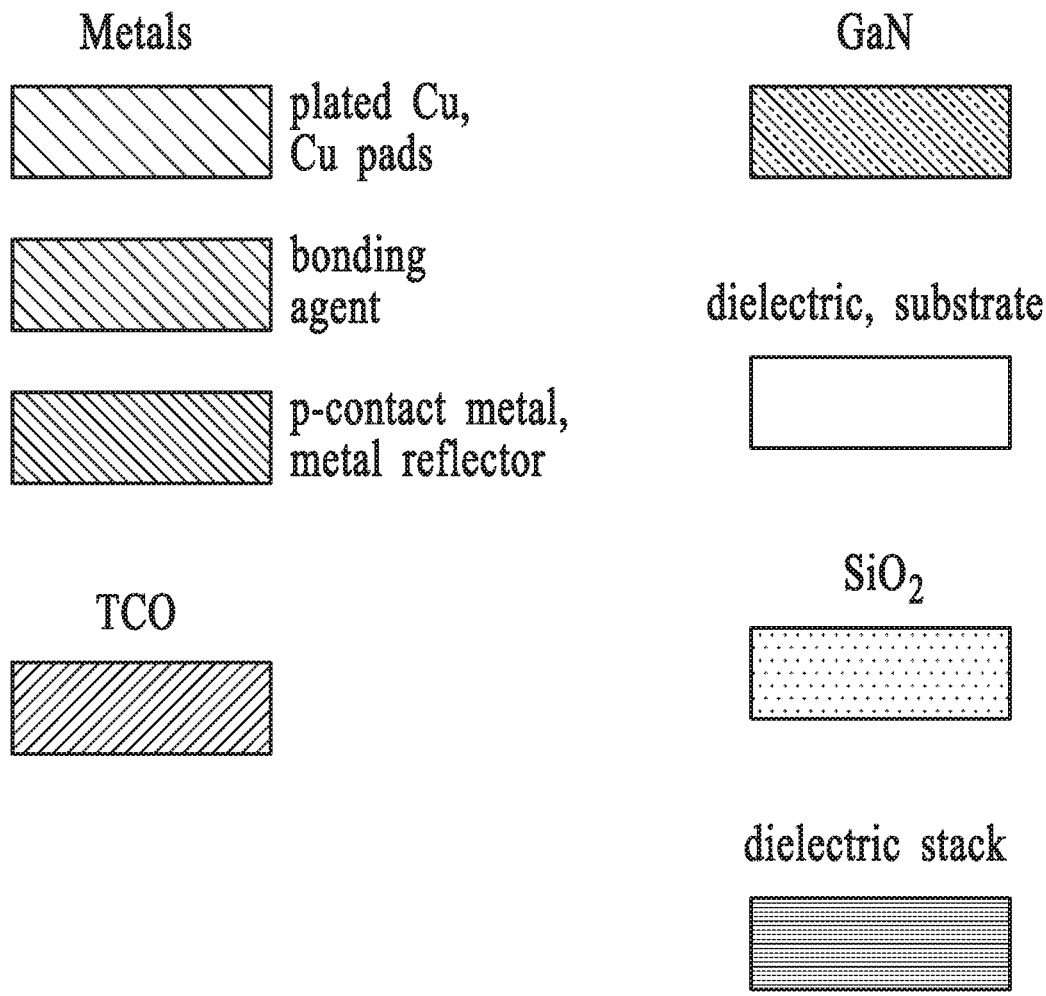
FIGS. 3A-3N show a process for manufacturing the femtoprojector display of FIGS. 1-2.

Fabrication processing preferably is performed on a wafer scale. FIGS. 3A-3N show a process for manufacturing a femtoprojector display using the frontplane and backplane of FIGS. 1-2. FIG. 3A is a legend that shows the cross hatch patterns used in this series of figures. Metals and other conductive materials are represented by a diagonal cross-hatch pattern. TCO is a transparent conductive oxide, for example indium tin oxide, aluminum zinc oxide, indium zinc oxide, indium cadmium oxide, and carbon nanotube layers. GaN is the gallium nitride region that includes the active region of the LED. GaN is a direct bandgap III-V semiconductor material that is well-suited for making LEDs. In FIG. 3A, dielectric and silicon dioxide ($SiO_2$) are materials that can provide electrical isolation, and the dielectric stack is used to provide wavelength selectivity.

Figure 3B:
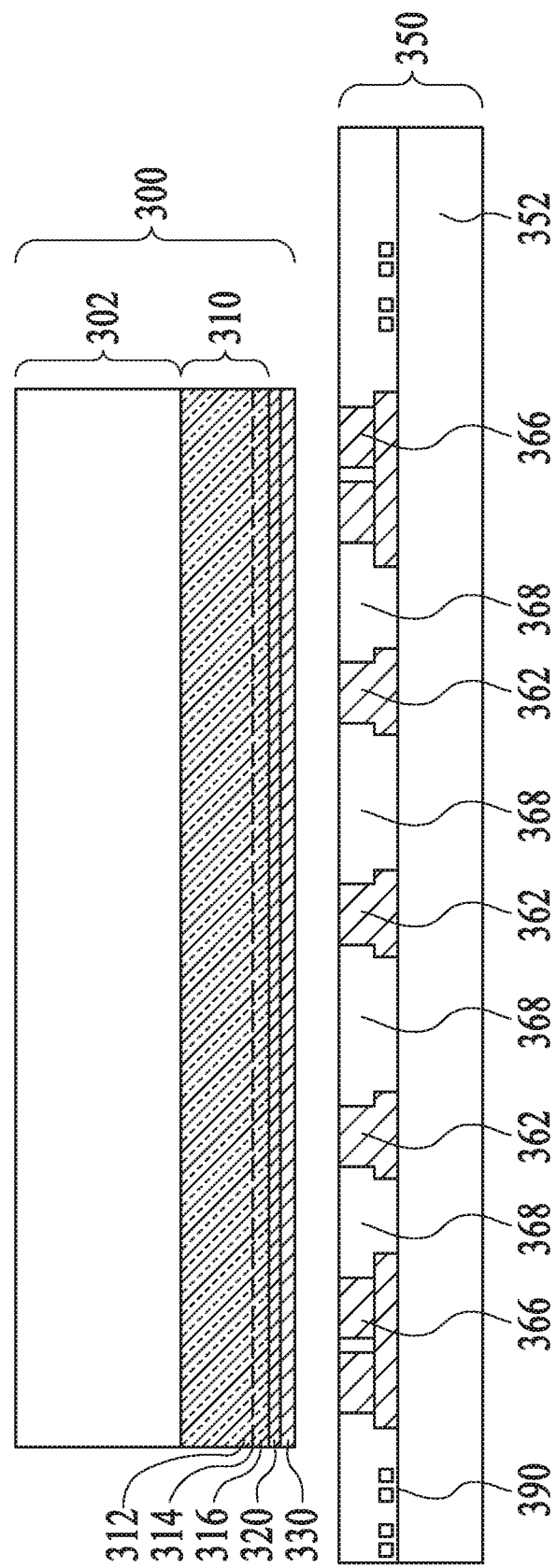

FIG. 3B shows a frontplane wafer 300 and a separate backplane wafer 350. The frontplane wafer 300 contains a GaN region 310 that is epitaxially grown on a substrate 302, which will be referred to as the frontplane substrate. Starting from the substrate, the GaN region 310 includes a buffer region (not labelled), an n-doped region 312, the active region 314 (represented by the dashed line) and a p-doped region 316. Typically, the GaN region 310 may have a total thickness of approximately 4-6 um. The active region 314 typically is very thin, for example 0.1 um or less if an InGaN multiple quantum well structure is used. The p-doped region 316 is also thin, perhaps 0.2 um and typically less than 0.5 um. The remainder is the n-doped region 312 and buffer region, which is relatively thick. This is because some thickness is required to allow the GaN growth to reach a sufficient quality. The GaN directly adjacent to the substrate 302 is a buffer region of poor quality.

P-contact metal 320 provides electrical contact to the p-doped region 316. In some designs, it also acts as a reflector for light generated by the active region 314. Examples of substrate 302 include sapphire. Other examples include silicon and silicon carbide. The frontplane wafer 300 in FIG. 3B is unpatterned. That is, the GaN region 310 has not yet been patterned into individual LEDs. This significantly reduces alignment requirements in attaching the frontplane wafer 300 to the backplane wafer 350.

The backplane wafer 350 contains LED driver circuits on a substrate 352. FIG. 3B does not show the actual LED driver circuits but shows copper pads 362,366 that are used to make electrical contact between the driver circuits and the LED contacts. Copper pads 366 provide electrical connection from the n-contacts of all of the LEDs to a common cathode on the backplane. Copper pads 362 provide connection from the p-contact metal 320 of each LED to the addressable driver circuitry for that LED. The fill 368 between copper pads 362,366 may be $SiO_2$ or $SiN_x$, which is used as an etch stop in subsequent processing steps. Typically, the backplane wafer 350 is a processed CMOS on silicon wafer. FIG. 3B also shows some alignment marks 390.

Figure 3C:
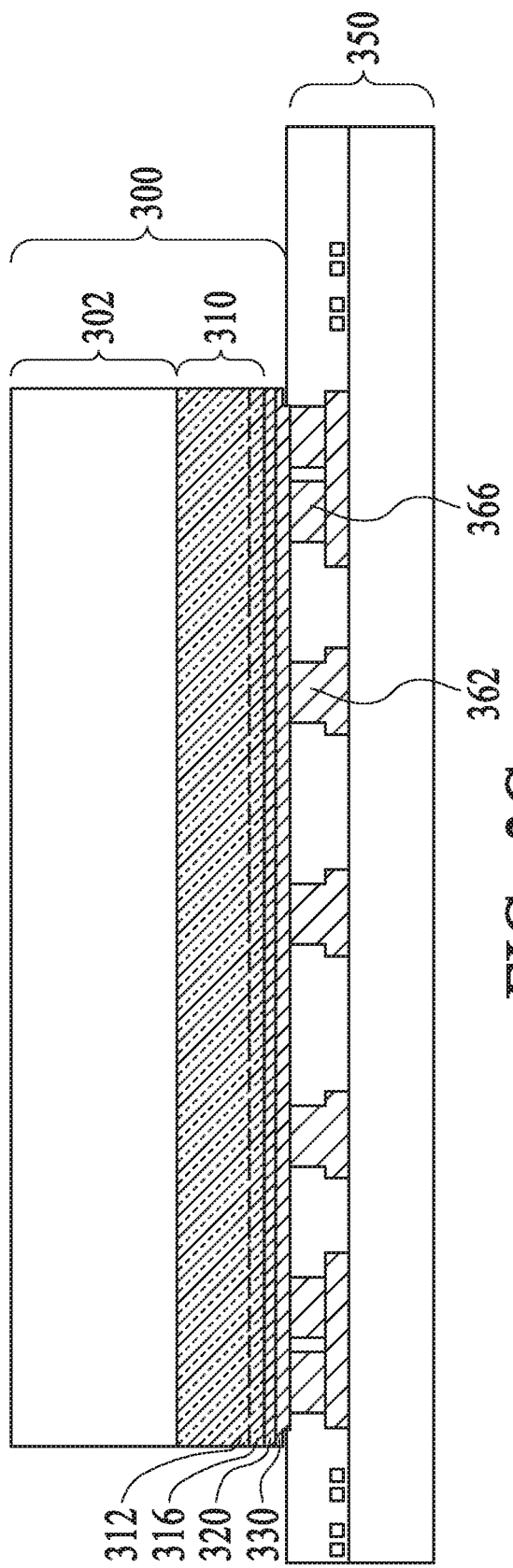

The frontplane wafer 300 is attached to the backplane wafer 350, resulting in the structure of FIG. 3C. In the example shown, the attachment is performed by non-solder surface bonding (e.g. by surface diffusion) between the p-contact metal 320 and the copper pads 362,366. A conductive bonding agent 330 is deposited on the p-contact metal 320 of the frontplane wafer. Examples of bonding agents include aluminum, indium tin oxide, aluminum-doped zinc oxide and aluminum with a surface coating of silicon, germanium or titanium to prevent oxidizing of the aluminum. The bonding agent 330 bonds to the copper pads 362,366. This mechanically attaches the two wafers to each other. It also provides an electrical connection between the p-contact metal 320 and the copper pads 362,366. This bonding step requires only rough alignment because the GaN region 310 has not yet been patterned into individual pixels. The bonding agent 330 may be selected to be compatible with further silicon wafer processing, and the bonding process itself occurs at temperatures and pressures that do not affect the already processed CMOS structures on the backplane.

In an alternative approach, both metal layers may be coated with a bonding agent. In this example, both the p-contact metal 320 and the copper pads 362,366 may be coated with a bonding agent and then bonded together.

In an alternative approach, the frontplane wafer 300 is coated with a solder, such as Sn or In, and attached to the backplane wafer 350 using solder bonding. The copper pads 362, 366 may also be coated with solder in this method.

After the two wafers 300,350 are bonded together, the frontplane substrate 302 is removed. Laser liftoff may be used to remove the sapphire substrate 302. Chemical approaches may also be used to remove the sapphire substrate 302. This exposes the buffer region of the GaN 310. Removal of the sapphire substrate 302 can create substantial shock, so doing that step before patterning the GaN region 310 is helpful from a standpoint of mechanical stability.

Figure 3D:
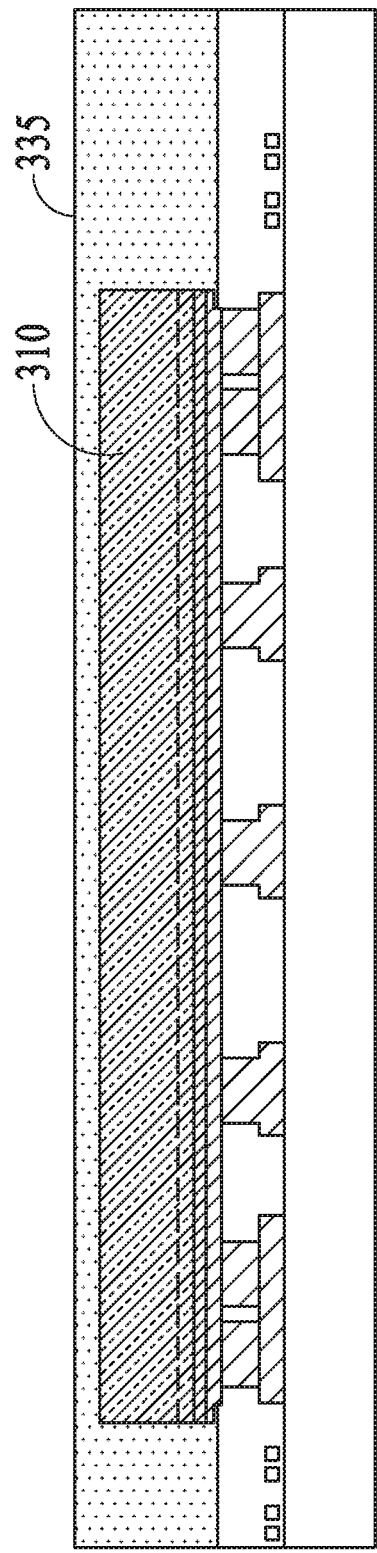

As shown in FIG. 3D, a dielectric fill such as silicon dioxide 335 is deposited to planarize the surface. Examples of other materials include SiN, benzocyclobutene (BCB), and spin-on glass.

The GaN region 310 is thinned, resulting in the structure of FIG. 3E. Chemical mechanical polishing and/or a blanket dry etch may be used to reduce the thickness of the GaN region 310. Thinning removes most or all of the GaN buffer region.

As shown in FIG. 3F, the GaN region is patterned into individual LED pillars 342R,G,B, which form the LEDs for red, green and blue color pixels for the display. In one approach, a deep etch is performed through the GaN region 310 and conductive bonding layer 330. The etch stops at the surface of the $SiN_x/SiO_2$ region 368. This also exposes the pads 366 for the common cathode.

The GaN region 310 of FIG. 3E is patterned into the individual LED pillars 342 of FIG. 3F by etching trenches between the pillars. These trenches may be 0.2-0.3 um wide. If the GaN were not thinned, the gaps between pillars would be 6 um tall and 0.2-0.3 um wide for a height:width aspect ratio in the range of 20-30. It is difficult to etch a narrow trench with such a high aspect ratio. It is also difficult to further process narrow trenches, such as coating or filling them. Thinning the GaN region reduces the aspect ratio of the trenches, which makes etching and other processes easier.

Thinning the GaN region also reduces the aspect ratio of the LED pillars 342, which improves their optical performance. FIG. 3 is not drawn to scale. Rather, the figures are drawn to illustrate the order of process steps and spatial relationships between various material layers. The LED pillars 342 without thinning may be 4-6 um tall and 0.5-1 um wide, for a height:width aspect ratio in the range of 4-12. Thinning the GaN region may remove 2-4 um of material, reducing the LED pillar to a height of not more than 2 um and reducing the aspect ratio by a factor of 2× to 3×.

Note that some areas of the bonding agent 330 are etched away when the GaN pixels are patterned. The conductive bonding agent 330 is selected so that it does not coat (e.g. sputtered as an etch byproduct) the sidewalls of the GaN LED pillars 342 in order to prevent shorting of the LEDs.

In FIG. 3G, the sidewalls of the LED pillars 342 are passivated. In one approach, atomic layer deposition is used to deposit a passivation material 344 over the entire structure, including on both the tops and sidewalls of the LED pillars 342. Example passivation materials include $Al_2O_3$, $TiO_2$, $SiO_2$, $SiN_X$, $HfO_X$, and $NbO_X$. A directional etch is used to etch the passivation material 344. This removes the passivation material from the horizontal surfaces, including the tops of the individual LED pillars, but leaves the passivation material on the sidewalls of the LED pillars. This approach does not require any lithography or fine alignment. The passivation material 344 electrically insulates the sides of the LED pillars 342 to prevent shorting of the LEDs.

Figure 3I:
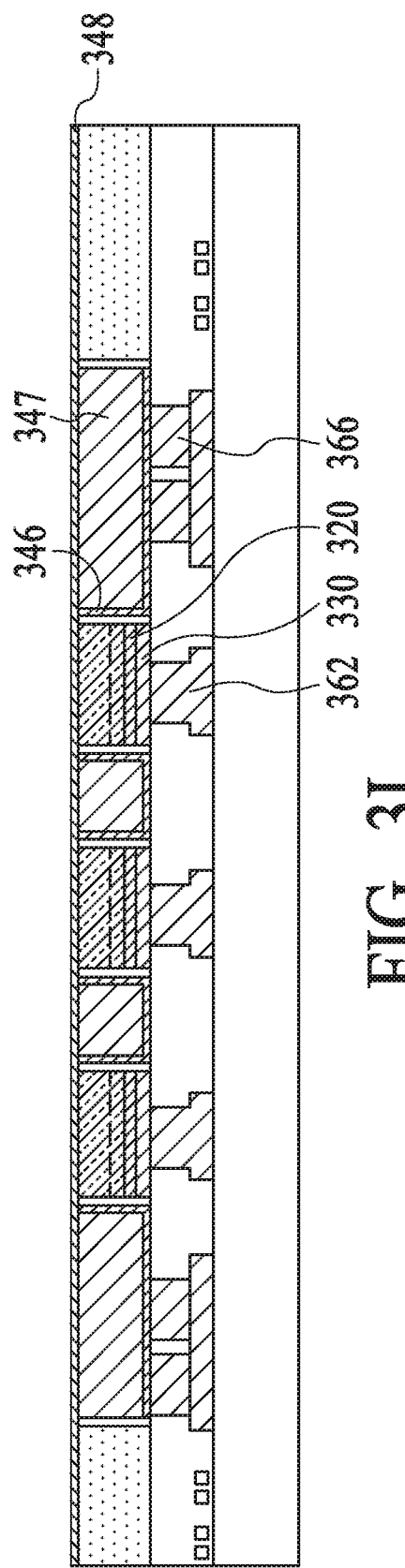

The electrical connection between the LED pillars 342 and the common cathode 366 are formed in FIGS. 3H-3I. In FIG. 3H, a thin, reflective metal lining 346 such as aluminum or ruthenium is deposited, followed by a fill metal 347 such as copper, aluminum or gold. This is planarized via chemical mechanical polishing to expose the GaN surface. In FIG. 3I, a thin layer of a transparent conductive oxide 348 (e.g. ITO) is deposited as a current spreading layer that provides an electrical connection to each pixel.

This completes the LED structures in the femtoprojector. Referring to FIG. 3I, the individual p-contacts for each LED are from the p-contact metal 320 through the conductive bonding agent 330 to the copper pad 362 to the addressable driver circuit. The n-contacts for all LEDs are through the transparent conductive oxide 348 to the metal 346/347 to the copper pad 366 to the common cathode.

Note that this process uses only one lithographic step. In FIG. 3F, fine resolution lithography is used to align the LED pillars 342 with their corresponding driver pads 362. However, insulating the sidewalls of the pillars (FIG. 3G) and forming the electrical network to the top contact of the individual LED pillars (FIGS. 3H-3I) are done without any lithography steps.

Figure 4:
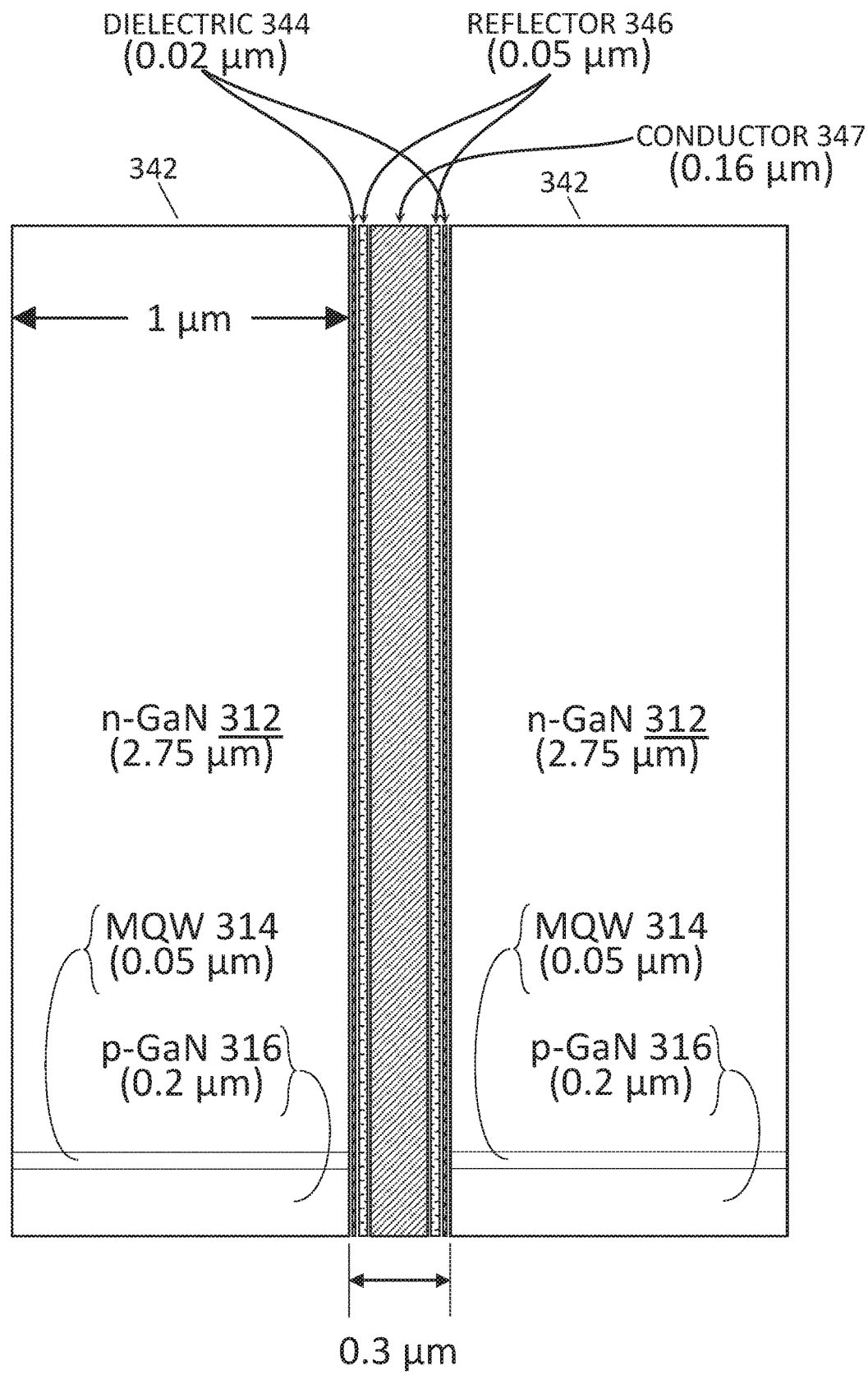
FIG. 4 shows a cross-sectional view of adjacent LED pillars from a frontplane for a femtoprojector display.

FIG. 4 shows a cross-sectional view of two adjacent LED pillars 342. FIG. 4 is drawn to scale using specific dimensions for the sake of illustration, but LED displays can be constructed using other dimensions. In this example, the LED pillars 342 include 2.75 um of n-doped GaN 312, 0.05 um of InGaN multiple quantum well action region 314, and 0.2 um of p-doped GaN 316. Light is generated at the active region 314, so the optical path from the active region to the exit of the LED at the far end of the n-doped region 312 is 2.75 um long. If the LED pillar is 1um wide, then this optical path has a height:width aspect ratio of 2.75:1. Light may reflect multiple times from the sidewalls before reaching the exit. Each reflection introduces some optical loss.

As described above, the sides of the LED pillar 342 are coated with a dielectric 344 (0.02 um), a metal layer 346 that acts as a bottom reflector (0.05 um) and metal fill 347 (0.16 um) which provides structural support and may also provide electrical connection to the common cathode pads. In order to fabricate these structures, with a 3 um tall LED pillar, a 3 um tall and 0.3 um wide trench is first etched between the LED pillars. This is a trench with a height:width aspect ratio of 10:1. The trench is 3 um deep because it electrically isolates the p-doped GaN 316 from adjacent pixels. The trench also extends through bottom metal 320 and bonding agent 330 so the total trench depth may be more than 3 um. The sidewalls are then conformally coated with the dielectric 344 and the reflector 346. This narrows the trench to 0.16 um (but still 3 um tall), when it is filled with metal 347.

If the GaN region had not been thinned, the LED pillar 342 would have been even taller, say 6 um tall. At this height, the optical path from active region 314 to exit would have an aspect ratio of 5.75:1, more than doubling the number of reflections before exiting the LED. In addition, the trench to be etched would have an aspect ratio of 20:1 and the metal fill 347 would occupy a space with aspect ratio of almost 40:1.

The dimensions given above are just examples. Typical ranges are the following. For the gap between pillars: 0.2-1 um for the full gap width, 0.01-0.05 um for dielectric 344 and 0.03-0.10 um for reflector 346. For the LED pillar: 1-5 um for n-GaN 312, 0.05±0.025 um for MQW 314, and 0.2±0.1 um for p-GaN 316. Below the GaN (not shown in FIG. 4): <50 nm for p-contact metal 320 (ITO, Ag, or NiAu) and <1 um for bonding agent 330.

Returning to FIG. 3, the steps in FIGS. 3A-3I were described in the context of attaching an LED frontplane wafer 300 to a silicon CMOS backplane wafer 350. This could also be done at the die level. For example, an LED frontplane wafer may be diced and individual, or groups of, LED frontplane dies 300 attached to corresponding backplane dies 350. The backplane dies may also be in wafer form or already diced into individual or groups of dies.

Figure 3J:
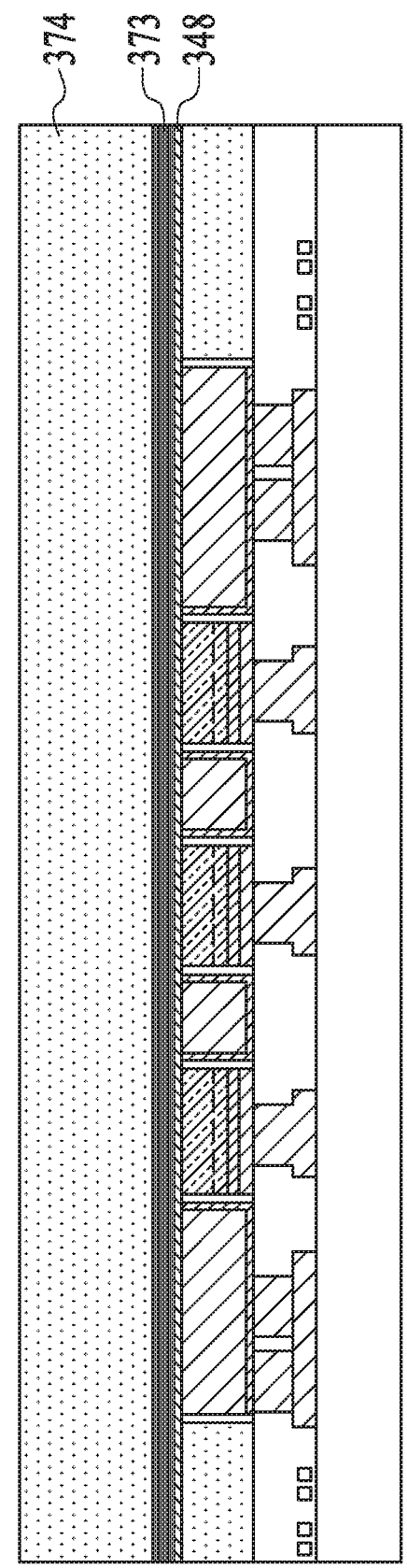
Figure 3K:
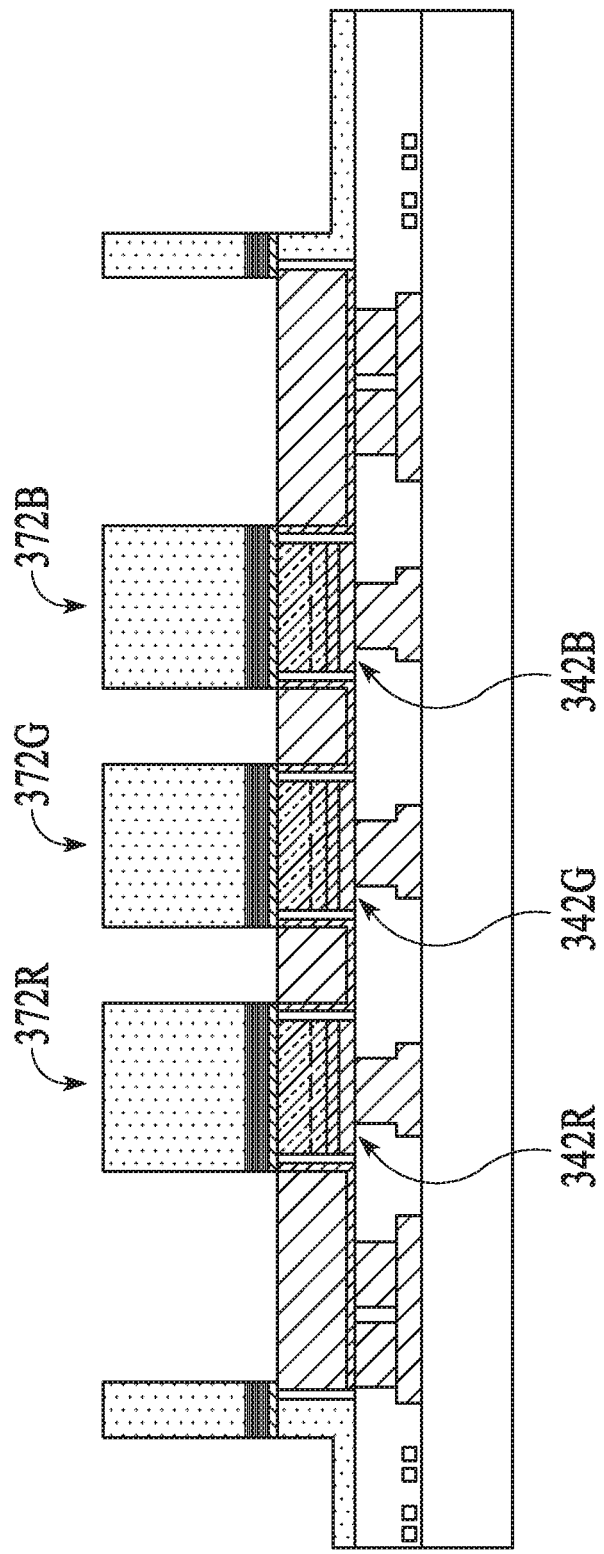
Figure 3L:
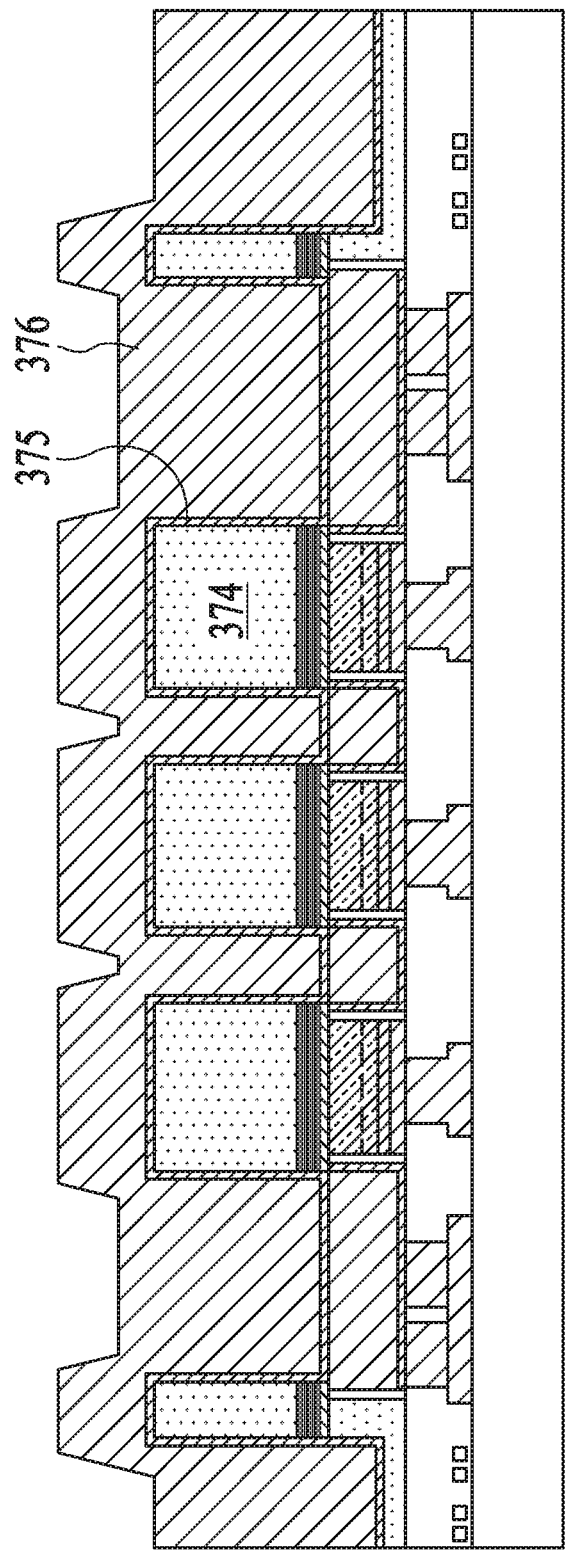
Figure 3M:
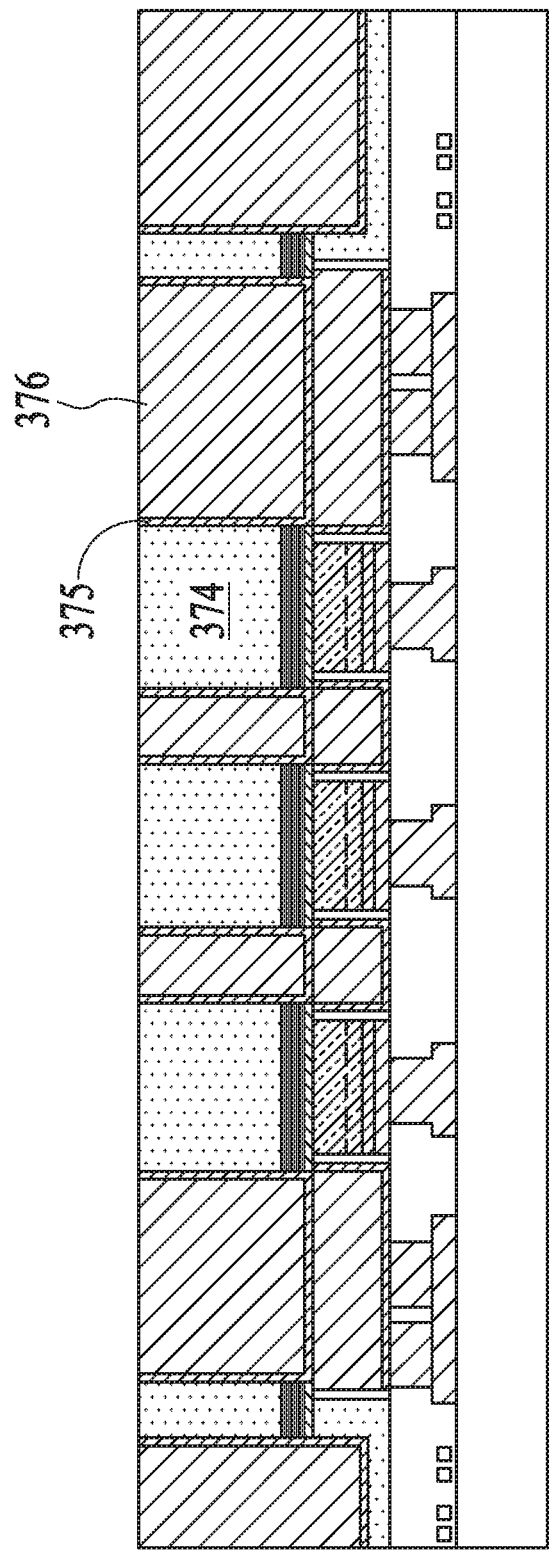
Figure 3N:
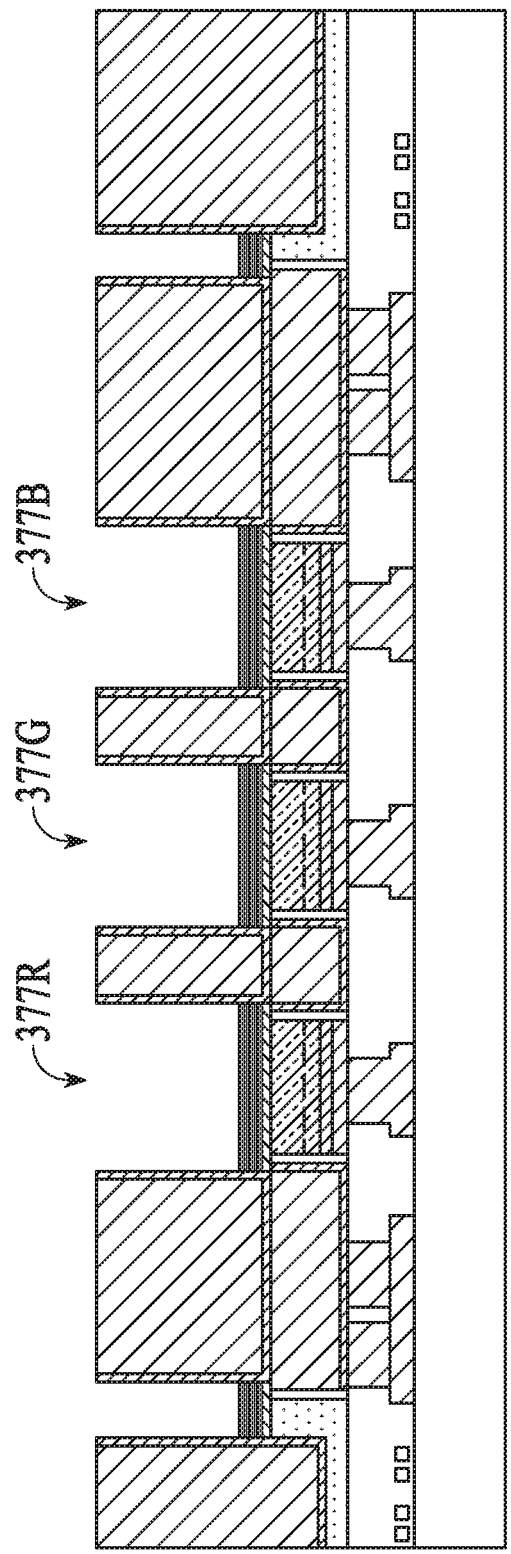

FIGS. 3J-3N show additional steps to add color conversion materials, which in this example are quantum dot materials. In FIG. 3J, a multi-layer dielectric stack 373 is deposited on the top surface. The dielectric stack 373 provides wavelength selectivity. For example, if the LEDs produce blue light, then the dielectric stack 373 may be designed to transmit blue light and reflect red and green light. A sacrificial layer 374, such as a thick oxide (e.g., $SiO_2$ or $SiN_x$) is deposited on the dielectric stack 373. In FIG. 3K, the dielectric stack 373 and thick oxide 374 are patterned into pillars 372R,G,B aligned with the LED pillars 342R, G,B. In FIG. 3L, a thin, reflective metal lining 375 such as aluminum or ruthenium is deposited, followed by a fill metal 376 such as copper or aluminum. In FIG. 3M, this is planarized via chemical mechanical polishing to expose the oxide 374. In FIG. 3N, the sacrificial layer 374 is removed, for example using a wet or dry chemical etch. This leaves a space 377 into which color conversion material may be deposited. A typical height for the space 377 is in a range of 1-3 um. Different materials may be deposited into different spaces 377, for example a quantum dot material 377R for color conversion from blue to red, a quantum dot material 377G for color conversion from blue to green, and no material 377B for the blue pixel. Another alternative is light scattering particles (e.g. $TiO_2$) for the blue pixel.

Alternatively, the color conversion layers may be formed as a separate die and then attached to the LED die on top of the backplane. This is then singulated to form separate femtoprojector displays, typically with width less than 1 mm.

Figure 5:
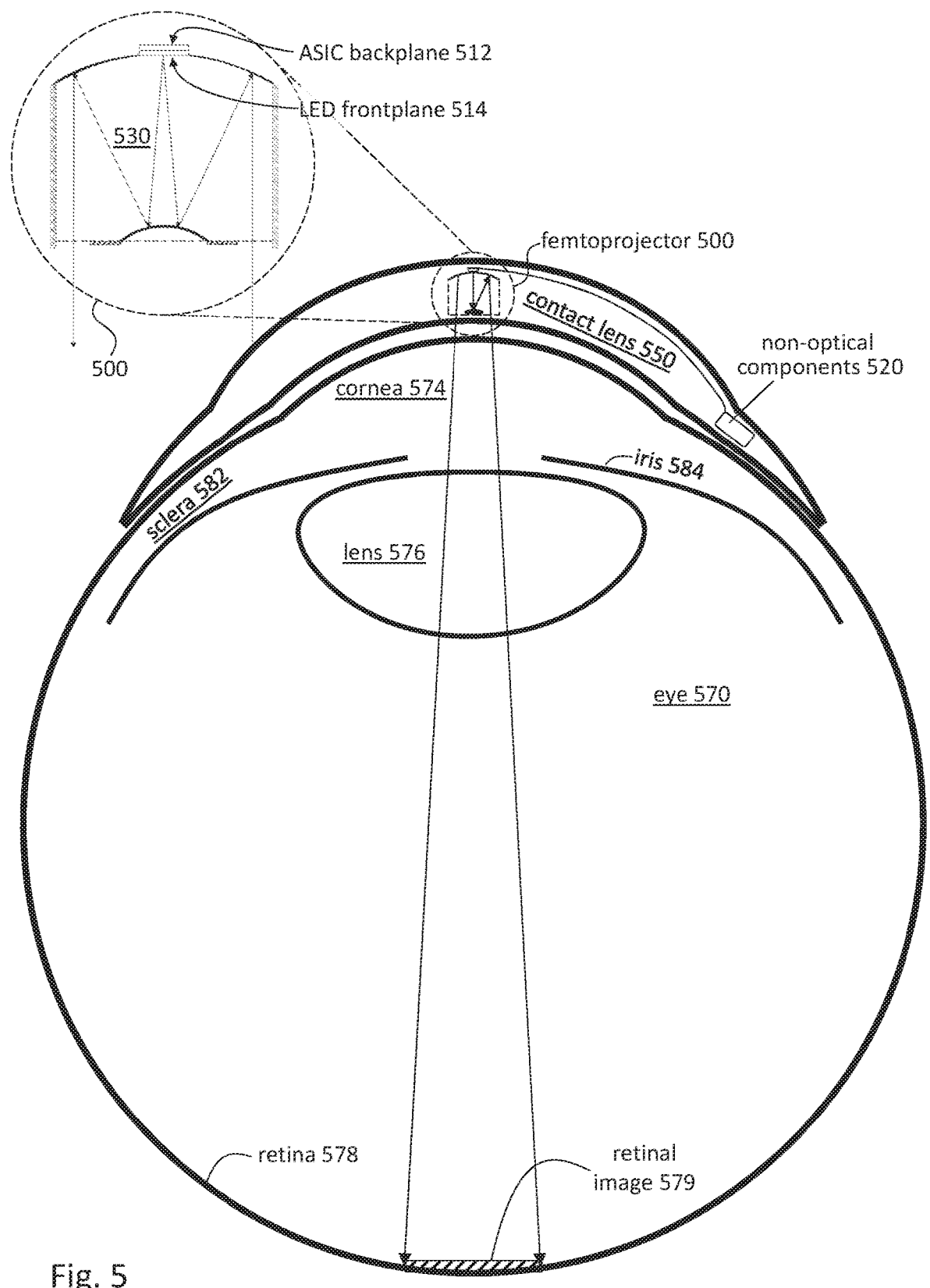
FIG. 5 shows a cross sectional view of an eye-mounted display containing a femtoprojector in a contact lens.

One possible use of such a monolithic ultra-dense LED display is to embed the display in a contact lens so that the displayed image overlays (or replaces) the wearer's view of the real world. FIG. 5 shows a cross sectional view of an eye-mounted display containing a femtoprojector 500 in a contact lens 550.

FIG. 5 shows an embodiment using a scleral contact lens which is preferred because scleral lenses are designed to not move on the cornea, but the contact lens does not have to be scleral. The aqueous of the eyeball is located between the cornea 574 and the crystalline lens 576 of the eye. The vitreous fills most of the eyeball including the volume between the crystalline lens 576 and the retina 578. The iris 584 limits the aperture of the eye.

The contact lens 550 preferably has a thickness that is less than two mm, and the femtoprojector 500 preferably fits in a 2 mm by 2 mm by 2 mm or smaller volume. The contact lens 550 is comfortable to wear and maintains eye health by permitting oxygen to reach the cornea 574. The femtoprojector 500 includes an image source 512/514 and an optical system 530. The image source includes a backplane 512 and a frontplane 514, examples of which have been described above. In this example, the backplane 512 is a CMOS application specific integrated circuit (ASIC) and the frontplane 514 includes a GaN LED array. The backplane electronics 512 receive data packets from a source external to the eye-mounted display. The backplane ASIC 512 converts the data packets to drive currents for the frontplane GaN LED array 514, which produces light that is projected by the optical system 530 to the user's retina 578.

The array of light emitters 514 may have non-uniform resolution. For example, the central area of the array may be imaged onto the fovea and therefore the center pixels have higher resolution (i.e., smaller pitch between pixels) compared to pixels on the periphery of the array. The pitches of the frontplane 512 and backplane 514 may be matched, in which case there is less area for each pixel driver in the center of the backplane compared to the periphery. Alternately, the backplane 514 may have a uniform pitch, where the frontplane 512 still has a variable pitch. In one approach, a wiring layer bridges between the uniform pitch backplane 514 and variable pitch frontplane 512. By using different wiring layers, the same backplane may be used with different frontplanes.

Eye-mounted femtoprojector displays may use a 200×200 array of color pixels. The display may be monochromatic or color. A three-color display with three LEDs per color pixel may have a total of at least 120,000 LEDs.

Another possible use of the monolithic ultra-dense LED display is in eyewear, such as glasses or goggles, to create an immersive visual experience or an image that overlays the wearer's view of the real world, such as in an augmented, mixed, or artificial reality application.

Although the detailed description contains many specifics, these should not be construed as limiting the scope of the invention but merely as illustrating different examples. It should be appreciated that the scope of the disclosure includes other embodiments not discussed in detail above. Various other modifications, changes and variations which will be apparent to those skilled in the art may be made in the arrangement, operation and details of the method and apparatus disclosed herein without departing from the spirit and scope as defined in the appended claims. Therefore, the scope of the invention should be determined by the appended claims and their legal equivalents.

What is claimed is:

1. A method for manufacturing a femtoprojector display, the method comprising:
    attaching a frontplane die to a backplane die, the backplane die comprising an array of LED driver circuits on a backplane substrate, and the frontplane die comprising a gallium nitride region grown on a frontplane substrate, where attaching the frontplane die to the backplane die comprises bonding a metal layer on the frontplane die to a metal layer on the backplane die, and where the bonding uses a bonding agent selected from aluminum; indium tin oxide; aluminum-doped zinc oxide; aluminum with a surface coating of silicon, germanium or titanium; Sn solder and In solder;
removing the frontplane substrate;
thinning the gallium nitride region; and
patterning the gallium nitride region into individual LED pillars having an active region of width not more than 2 um, where thinning the gallium nitride region reduces a height of the individual LED pillars as measured from the active region to a top of the gallium nitride region to less than 3 um.

2. The method of claim 1 where the backplane substrate is a silicon substrate, the LED driver circuits are CMOS circuits, and the metal layer on the backplane substrate is a copper layer.

3. The method of claim 1 where thinning the gallium nitride region reduces a ratio of the height to the width to less than 5:1.

4. The method of claim 3 where the trenches separating adjacent individual LED pillars have a width of not more than 0.5 um.

5. The method of claim 3 where the trenches separating adjacent individual LED pillars have a height-to-width aspect ratio of at least 4:1.

6. The method of claim 1 where thinning the gallium nitride region reduces a thickness of the gallium nitride region by at least 3 um.

7. The method of claim 1 where patterning the gallium nitride region into individual LED pillars comprises dry etching trenches into the gallium nitride region to pattern the individual LED pillars.

8. A method for manufacturing a femtoprojector display, the method comprising:
attaching a frontplane die to a backplane die, the backplane die comprising an array of LED driver circuits on a backplane substrate, and the frontplane die comprising a gallium nitride region grown on a frontplane substrate;
removing the frontplane substrate;
thinning the gallium nitride region;
after removing the frontplane substrate, planarizing the frontplane die before thinning the gallium nitride region; and
patterning the gallium nitride region into individual LED pillars having an active region of width not more than 2 um, where thinning the gallium nitride region reduces a height of the individual LED pillars as measured from the active region to a top of the gallium nitride region to less than 3 um.

9. The method of claim 8 where growth of the gallium nitride region on the frontplane substrate results in a buffer region in the gallium nitride region adjacent to the frontplane substrate, and thinning the gallium nitride region removes the buffer region.

10. The method of claim 8 where thinning the gallium nitride region reduces a ratio of the height to the width to less than 5:1.

11. The method of claim 8 where thinning the gallium nitride region reduces a thickness of the gallium nitride region by at least 3 um.

12. The method of claim 8 where removing the frontplane substrate comprises using a liftoff process to remove the frontplane substrate.

13. The method of claim 8 where patterning the gallium nitride region into individual LED pillars comprises dry etching trenches into the gallium nitride region to pattern the individual LED pillars.

14. The method of claim 13 where the trenches separating adjacent individual LED pillars have a width of not more than 0.5 um.

15. The method of claim 13 where the trenches separating adjacent individual LED pillars have a height-to-width aspect ratio of at least 4:1.

16. A method for manufacturing a femtoprojector display, the method comprising:
attaching a frontplane die to a backplane die, the backplane die comprising an array of LED driver circuits on a backplane substrate, and the frontplane die comprising a gallium nitride region grown on a frontplane substrate;
removing the frontplane substrate;
thinning the gallium nitride region; and
patterning the gallium nitride region into individual LED pillars having an active region of width not more than 2 um, where thinning the gallium nitride region reduces a height of the individual LED pillars as measured from the active region to a top of the gallium nitride region to less than 3 um; where patterning the gallium nitride region into individual LED pillars comprises:
lithographically masking areas of the gallium nitride region to define the individual LED pillars; and
etching trenches into areas of the gallium nitride region that are not masked; and
without any lithography steps:
passivating sidewalls of the individual LED pillars; and
forming electrical contacts to top contacts of the individual LED pillars.

17. The method of claim 16 where passivating sidewalls of the individual LED pillars comprises:
using atomic layer deposition to deposit a passivation material on the sidewalls and tops of the individual LED pillars; and
without a use of lithography, etching the deposited passivation material to remove the passivation material from the tops of the individual LED pillars but leaving passivation material on the sidewalls of the individual LED pillars.

18. The method of claim 16 further comprising:
depositing a multi-layer dielectric stack on a top surface of the individual LED pillars, the multi-layer dielectric stack providing wavelength selectivity.

19. The method of claim 18 further comprising:
depositing a sacrificial layer on the multi-layer dielectric stack;
patterning the multi-layer dielectric stack and sacrificial layer into individual pillars aligned with the individual LED pillars;
depositing fill material in spaces between the individual pillars of the sacrificial layer;
removing the sacrificial layer to create voids defined by the fill material; and
filling at least some of the voids with wavelength-conversion material that converts light produced by the individual LED pillars to a different wavelength, where the multi-layer dielectric stack passes light from the individual LED pillars and reflects light converted to the different wavelength.

20. The method of claim 19 where the wavelength-conversion material includes quantum dots.

21. The method of claim 16 where thinning the gallium nitride region reduces a ratio of the height to the width to less than 5:1.

22. The method of claim 16 where thinning the gallium nitride region reduces a thickness of the gallium nitride region by at least 3 um.

23. The method of claim 16 where the trenches separating adjacent individual LED pillars have a width of not more than 0.5 um.

24. The method of claim 16 where the trenches separating adjacent individual LED pillars have a height-to-width aspect ratio of at least 4:1.

* * * * *